United States Patent [19]

Seki

[11] 4,321,428
[45] Mar. 23, 1982

[54] ACOUSTIC MONOLITHIC POWER SEMICONDUCTOR INTEGRATED CIRCUIT AND ACOUSTIC SYSTEM USING THE SAME

[75] Inventor: Kunio Seki, Hinode, Japan

[73] Assignee: Hitachi, Ltd., Tokyo, Japan

[21] Appl. No.: 87,765

[22] Filed: Oct. 24, 1979

[30] Foreign Application Priority Data

Nov. 24, 1978 [JP] Japan ................. 53-144199

[51] Int. Cl.³ .............................................. H03F 3/00
[52] U.S. Cl. ................................... 179/1 A; 330/307; 330/252
[58] Field of Search ................... 179/1 A; 330/124 R, 330/295, 310, 307, 252, 254, 260

[56] References Cited

U.S. PATENT DOCUMENTS

| | | | |
|---|---|---|---|
| 3,542,953 | 11/1970 | Munch | 179/1 A |
| 3,577,090 | 5/1971 | Montgomery | 330/69 |
| 4,081,757 | 3/1978 | Rumbaugh | 330/124 R |

FOREIGN PATENT DOCUMENTS

| | | | |
|---|---|---|---|
| 1134141 | 8/1962 | Fed. Rep. of Germany | 179/1 G |
| 2124991 | 12/1971 | Fed. Rep. of Germany | 179/1 GQ |
| 2125398 | 12/1971 | Fed. Rep. of Germany | 179/1 GQ |
| 2126432 | 3/1972 | Fed. Rep. of Germany | 179/1 GQ |
| 2146197 | 4/1972 | Fed. Rep. of Germany | 179/1 GQ |
| 2253987 | 5/1974 | Fed. Rep. of Germany | 330/295 |
| 2618030 | 10/1977 | Fed. Rep. of Germany | 330/310 |
| 2142880 | 2/1973 | France | 179/1 G |
| 1136004 | 12/1968 | United Kingdom | 330/252 |
| 1204617 | 9/1970 | United Kingdom | 330/124 R |
| 1332515 | 10/1973 | United Kingdom | 179/1 G |
| 1370108 | 10/1974 | United Kingdom | 330/307 |
| 1454894 | 11/1976 | United Kingdom | 179/1 G |
| 1467059 | 3/1977 | United Kingdom | 330/252 |
| 1530795 | 11/1978 | United Kingdom | 330/310 |

OTHER PUBLICATIONS

IEEE Transactions on Broadcast and TV Receivers, Jul. 1969, pp. 177-185, by Kaplan.
Radio Ternsehen Elektronik, vol. 23, No. 19, pp. 636-637 (1974), by Malessa.

Primary Examiner—Raymond F. Cardillo, Jr.
Assistant Examiner—Alan Faber
Attorney, Agent, or Firm—Craig and Antonelli

[57] ABSTRACT

An acoustic monolithic IC, which is enabled by a simple modification of the external circuit thereof to realize either the amplification of the left and right channels of stereophonic signals or the application to a balanced transformer-less (BTL) amplifier circuit, is composed of first and second differential amplifier circuits each having non-inverting and inverting inputs and of first and second amplifier output circuits each having non-inverting and inverting inputs.

The first differential amplifier circuit has its non-inverting and inverting inputs led as the first and second input terminals of the acoustic monolithic IC to the outside thereof whereas the second differential amplifier circuit has its non-inverting and inverting inputs led as the third and fourth input terminals of the acoustic monolithic IC to the outside thereof.

The output signals of the first and second differential amplifier circuits are impressed upon the non-inverting inputs of the first and second amplifier output circuits, respectively. The inverting inputs of the first and second amplifier output circuits are led as first and second feedback terminals to the outside of the acoustic monolithic IC so as to determine the gains and output DC levels of those amplifier output circuits.

The output terminals of the first and second amplifier output circuits are led as the first and second output terminals of the acoustic monolithic IC to the outside thereof.

6 Claims, 5 Drawing Figures

ACOUSTIC MONOLITHIC POWER SEMICONDUCTOR INTEGRATED CIRCUIT AND ACOUSTIC SYSTEM USING THE SAME

BACKGROUND OF THE INVENTION

1. Field of the Invention

The present invention relates to an acoustic monolithic power IC (or semiconductor integrated circuit) and an acoustic system using the same.

2. Description of the Prior Art

An acoustic system to be carried on a vehicle such as an automobile may be composed of front speakers and rear speakers. The sound volumes of the front and rear speakers can be changed as desired so that the acoustic reproduction can be accomplished under any desired conditions, e.g., mainly by the front speakers, mainly by the rear speakers, or in the same volume by the front and rear speakers. According to one prior art method, the front and rear speakers are driven by output amplifiers which have their levels adjusted at their input sides and which are made independent of one another. According to another prior art system, on the other hand, the front and rear speakers are connected with the output of one output amplifier through a plurlity of level adjusting variable attenuators so that they may be driven. The sound volumes of the front and rear speakers can be varied by adjusting the variable attenuators. The latter system has an advantage that the number of the output amplifiers can be minimized.

The aforementioned variable attenuators are, however, relatively expensive because they are required to admit relatively high currents. In case, moreover, a BTL (Balanced Transformer Less) amplifier is used as the output amplifier to increase the output power for an identical supply voltage, the variable attenuators, which are relatively expensive, as noted above, have to be connected with one pair of output terminals, respectively, with a view of adjusting the sound volumes of the front and rear speakers. For the stereophonic acoustic reproduction, it is necessary that two sets of the aforementioned output amplifiers and volumes be used.

SUMMARY OF THE INVENTION

It is therefore an object of the present invention to provide an acoustic monolithic power IC, which can be used for multiple purposes, and an acoustic system which has its production cost reduced.

Another object of the present invention is to provide an acoustic system of the type in which the number of output amplifiers is minimized and in which the sound volume adjustments of front and rear speakers can be accomplished at the input sides of the amplifiers.

According to a feature of the present invention, a righthand front speaker, a lefthand front speaker, a righthand rear speaker and a lefthand rear speaker are connected between the respective output terminals of two output BTL amplifiers, respectively. The sound volumes of the four speakers are adjusted by means of fader control variable attenuators which are disposed at the input sides of the aforementioned two output BTL amplifiers.

According to another feature of the present invention, the output BTL amplifiers are made of monolithic power ICs.

There are disposed at the inputs of the monolithic power amplifiers such differential amplifier circuits as have their inputs used as the non-inverting and inverting input terminals of the monolithic power ICs.

DESCRIPTION OF THE PREFERRED EMBODIMENTS

The present invention will be described in detail in connection with the embodiments thereof with reference to the accompanying drawings.

Figure 1:
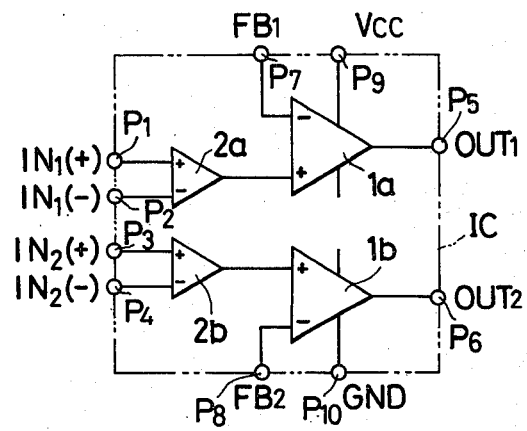
FIG. 1 shows a system block of an acoustic monolithic power IC according to one embodiment of the present invention.

FIG. 1 is a block diagram of a monolithic power IC showing one embodiment of the present invention.

In FIG. 1, the following circuits and external terminals are provided as the monolithic power IC which corresponds to the portion enclosed by broken lines.

There are provided two differential amplifier circuits $2a$ and $2b$ which have their outputs connected respectively with the non-inverting inputs (+) of amplifier output circuits $1a$ and $1b$ constituting the power IC. The non-inverting inputs (+) and inverting inputs (−) of those differential amplifier circuits $2a$ and $2b$ are used as the input terminals $IN_{1(+)}$, $IN_{1(-)}$, $IN_{2(+)}$ and $IN_{2(-)}$ of the monolithic power IC.

Incidentally, the inverting inputs (−) of the amplifier output circuits $1a$ and $1b$ are connected with external terminals $FB_1$ and $FB_2$ for constituting a feedback circuit. Moreover, the aforementioned amplifier output circuits $1a$ and $1b$ have their outputs connected with the outputs $OUT_1$ and $OUT_2$, respectively, thereby to provide supply terminals $V_{cc}$ and GND, respectively.

Figure 3:
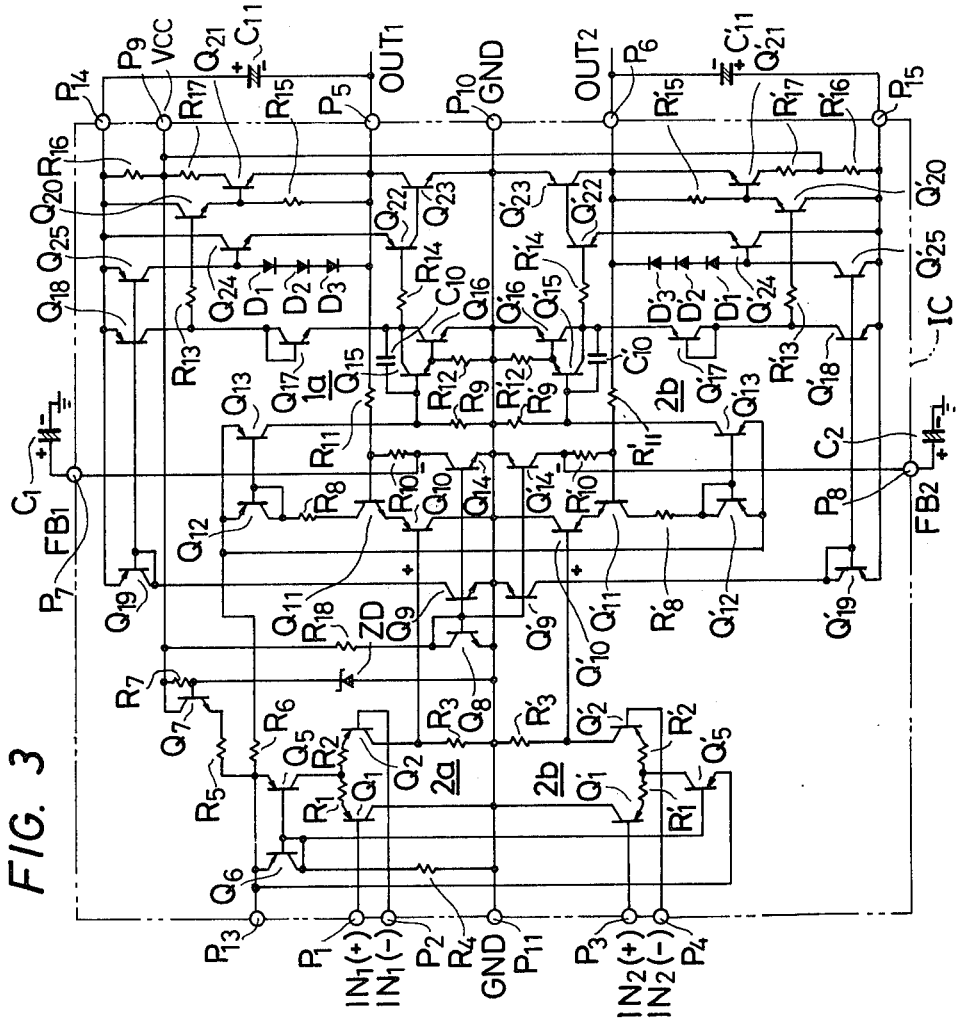
FIG. 3 shows in detail the internal circuit diagram of the acoustic monolithic power IC shown in FIG. 1.

The differential amplifier circuits $2a$ and $2b$, which are disposed at the input portion of the monolithic power IC are composed, as better seen from FIG. 3, of differential paired transistors $Q_1$, $Q_2$, $Q_1'$ and $Q_2'$, load resistors $R_3$ and $R_3'$, and constant current source transistors $Q_5$ and $Q_5'$. A bias circuit is composed of a transistor $Q_6$ and a resistor $R_4$. The base-emitter voltage of the transistor $Q_6$ having its collector and base connected is impressed between the base and emitter of the transistors $Q_5$ and $Q_5'$ so that a substantially preset constant current will flow through the transistors $Q_5$ and $Q_5'$.

The base electrodes of the differential paired transistors $Q_1$ and $Q_1'$ are connected as the non-inverting terminals (+) of the differential amplifier circuits $2a$ and $2b$ with the external terminals $P_1$ and $P_3$ of the monolithic power IC, respectively. The base electrodes of the other differential paired transistors $Q_2$ and $Q_2'$ are connected as the inverting input terminals (−) of the differential amplifier circuits $2a$ and $2b$ with the external terminals $P_2$ and $P_4$ of the monolithic power IC, respectively.

The output signals of the differential amplifier circuits $2a$ and $2b$ are generated at the connections between the collector electrodes of the other transistors $Q_2$ and $Q_2'$ and the load resistors $R_3$ and $R_3'$, respectively.

A zenor diode ZD, a resistor $R_7$ and a transistor $Q_7$ constitute together a constant voltage regulator. As a result, a substantially constant operating voltage is generated at the emitter of the transistor $Q_7$ independently of a voltage $V_{cc}$ which is to be impressed upon the supply voltage terminal $P_9$ of the monolithic power IC.

The amplifier output circuits $1a$ and $1b$ are composed, as shown in FIG. 3, of modified type differential amplifier circuits, which are composed of transistors $Q_{10}$, $Q_{10}'$, $Q_{11}$ and $Q_{11}'$ and resistors $R_9$ and $R_9'$, and first amplifier stages which are composed of current mirror transistors $Q_{12}$, $Q_{12}'$, $Q_{13}$ and $Q_{13}'$.

The base electrodes of the transistors $Q_{10}$ and $Q_{10}'$ of the first amplifier stage are supplied with the output signals of the differential amplifier circuits $2a$ and $2b$ as the non-inverting inputs (+) of the amplifier output circuits $1a$ and $1b$.

The first amplifier stages thus constructed are supplied with a substantially constant operating voltage from the aforementioned constant voltage regulator through the resistors $R_5$ and $R_6$. The resistor $R_5$ has its one end connected through a terminal $P_{13}$ with a supply voltage ripple eliminating filter capacitor so that the differential amplifier circuits $2a$ and $2b$ and the first amplifier stages can be remarkably stably operated.

The base electrodes of the transistors $Q_{11}$ and $Q_{11}'$ of the aforementioned first amplifier stages are supplied with the output signals $OUT_1$ and $OUT_2$ of output terminals $P_5$ and $P_6$ through DC and AC negative feedback circuits which are composed of resistors $R_{11}$, $R_{11}'$, $R_{10}$ and $R_{10}'$, constant current transistors $Q_{14}$ and $Q_{14}'$ and capacitors $C_1$ and $C_2$ connected with negative feedback external terminals $P_7$ and $P_8$. As a result, the AC voltage gains of the amplifier output circuits $1a$ and $1b$ are determined, and the output DC levels of the output terminals $P_5$ and $P_6$ are maintained at a substantially half level of the supply voltage $V_{cc}$.

Incidentally, constant current transistors $Q_{14}$ and $Q_{14}'$ are biased by a bias circuit which is composed of a resistor $R_{18}$ and a transistor $Q_8$.

The output signals of the first amplifier stages to be generated at the resistors $R_9$ and $R_9'$ are amplified by means of drive amplifier stages which are composed of transistors $Q_{15}$, $Q_{15}'$, $Q_{16}$ and $Q_{16}'$ of Darlington connection type, resistors $R_{12}$ and $R_{12}'$, phase compensation capacitors $C_{10}$ and $C_{10}'$, transistors $Q_{17}$ and $Q_{17}'$ and constant current load transistors $Q_{18}$ and $Q_{18}'$. The output signals of the drive amplifier stages thus constructed are fed both to the Darlington connection type transistors $Q_{20}$, $Q_{20}'$, $Q_{21}$ and $Q_{21}'$ and to the complementary connection type transistors $Q_{22}$, $Q_{22}'$, $Q_{23}$ and $Q_{23}'$ of the output amplifier stages.

The emitters of the transistors $Q_{22}$ and $Q_{22}'$ are connected with the idling current adjusting circuits, which are composed of diodes $D_1$ to $D_3$ and $D_1'$ to $D_3'$ and transistors $Q_{24}$ and $Q_{24}'$, so that the crossover distorsion of the output amplifier stages can be reduced.

Moreover, a bootstrap capacitor $C_{11}$ is connected between the output terminal $P_5$ and an external terminal $P_{14}$ whereas a bootstop capacitor $C_{11}'$ is connected between the output terminal $P_6$ and an external terminal $P_{15}$.

The power IC thus constructed can be used not only as a stereophonic two-channel power IC but also as a BTL circuit, which is enabled to have a high output by using one of the amplifier circuits as a positive phase amplifier circuit and the other as a negative phase amplifier circuit, by supplying them with a common input, and by connected a load between their respective outputs.

Figure 4:
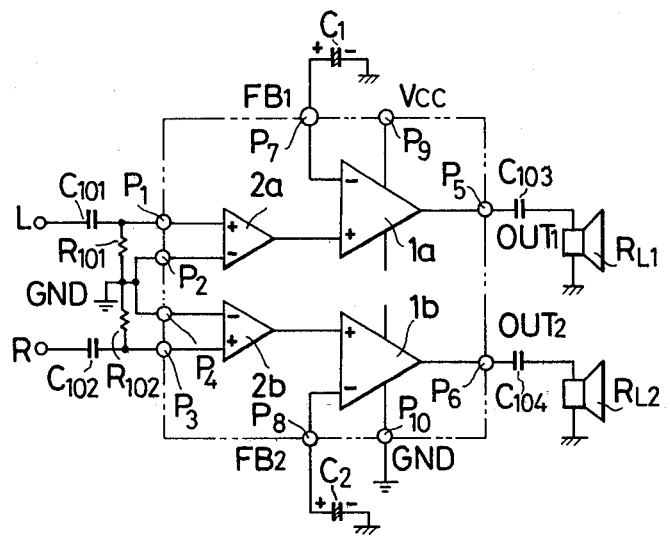
FIG. 4 shows a circuit exemplifying the present invention, in which the acoustic monolithic power ICs according to the embodiment shown in FIG. 1 are used for amplification of stereophonic two-channel signals.

FIG. 4 shows an embodiment, in which the power IC according to the present invention is used for amplifying the sterophonic two-channel signals. The left and right channel signals L and R of the stereophonic two-channel signals are impressed through input coupling capacitors $C_{101}$ and $C_{102}$, respectively, upon the external terminals $P_1$ and $P_3$ which are the non-inverting input terminals of the differential amplifier circuits $2a$ and $2b$. Those external terminals $P_1$ and $P_3$ are grounded to the earth through resistors $R_{101}$ and $R_{102}$, respectively, so that their DC levels can be maintained at the earth potential. On the other hand, the external terminals $P_2$ and $P_4$ which are the inverting input terminals of the differential amplifier circuits $2a$ and $2b$ are also grounded to the earth. Moreover, the external terminals $P_5$ and $P_6$ which are the output terminals of the amplifier output circuits $1a$ and $1b$ are connected through output coupling capacitors $C_{103}$ and $C_{104}$ with speaker loads $R_{L1}$ and $R_{L2}$. The speaker load $R_{L1}$ is supplied with the left channel amplifier signals whereas the speaker load $R_{L2}$ is supplied with the right channel amplifier signals.

Figure 5:
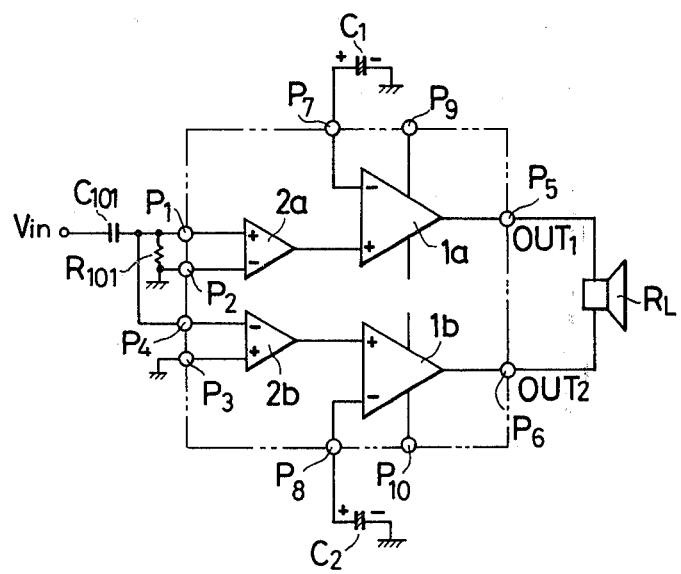
FIG. 5 shows a circuit exemplifying the present invention, in which the acoustic monolithic power ICs according to the embodiment shown in FIG. 1 are used in a BTL amplifier.

FIG. 5 shows the embodiment, in which the power IC according to the present invention is used as the BTL circuit. Monaural signals $V_{in}$ are impressed through the input coupling capacitor $C_{101}$ upon the external terminal $P_1$ acting as the non-inverting input terminal of the differential amplifier circuit $2a$ and the external terminal $P_4$ acting as the inverting input terminal of the differential amplifier circuit $2b$. As a result, the output signals of both of the differential amplifier circuits $2a$ and $2b$ are in opposite phases to each other. As a result, the speaker load $R_L$, which has its both ends connected directly with the output terminals of the amplifier output circuits $1a$ and $1b$, is driven by the amplified monaural signals.

From the foregoing description, it is understood that the power IC according to the present invention can be applied to the stereophonic two-channel signal amplification and to the BTL circuit merely by simply modifying the external circuit.

Figure 2:
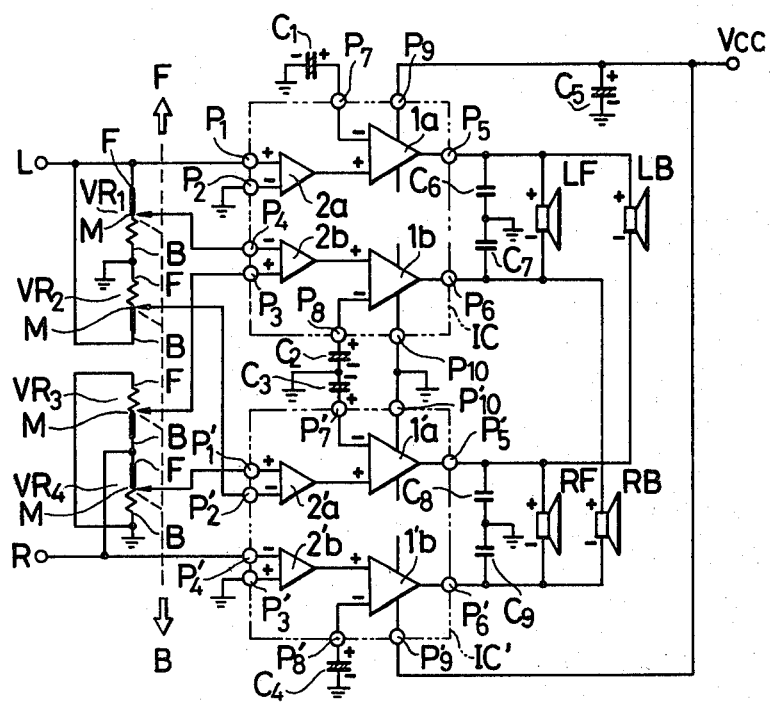
FIG. 2 shows a four-amplifier and four-speaker acoustic system using two of the acoustic monolithic power ICs according to the embodiment shown in FIG. 1.

As shown in FIG. 2, the embodiment circuit can also be used in a four-amplifier and four-speaker acoustic system. In this case, the fader control can be accomplished at the input until so that the production cost can be reduced.

In this embodiment circuit, more specifically, the aforementioned two-channel power integrated circuits IC and IC' are used. A left channel front speaker LF is connected between the output terminals $P_5(OUT_1)$ and $P_6(OUT_2)$ of the power integrated circuit IC. A right channel front speaker RF is connected between the output terminals $P_5'(OUT_1')$ and $P_6'(OUT_2')$ of the power integrated circuit IC'. A left channel back speaker LB is connected between the output terminal of $P_5(OUT_1)$ of the power integrated circuit IC and the output terminal $P_5'(OUT_1')$ of the power integrated circuit IC'. Moreover, a right channel back speaker RB is connected between the output terminal $P_6(OUT_2)$ of the power integrated circuit IC and the output terminal $P_6'(OUT_2')$ of the power integrated circuit IC'.

There are provided the input terminals of the aforementioned power integrated circuits IC and IC' such fader control circuits as will be described in the following.

The aforementioned power integrated circuit IC has its input terminal $P_1(IN_{1(+)})$ supplied with the left channel input signals L and its other input terminal $P_2(IN_{1(-)})$ grounded to the earth. As a result, the amplifier circuits $2a$ and $1a$ are used as the positive phase amplifier output circuits.

On the other hand, the power integrated circuit IC' has its input terminal $P_4'(IN_{2(-)})$ supplied with the right channel input signals R and its other input terminal $P_3'(IN_{2(+)})$ grounded to the earth. As a result, the amplifier circuits $2b'$ and $1b'$ are used as the opposite phase amplifier output circuits.

On the other hand, the other amplifier circuits have their inputs supplied through fader control attenuators $VR_1$ to $VR_4$ with the following input signals.

The attenuators $VR_1$ to $VR_4$ are of MN type, in which one is made of an conductor so that the attenuation is reduced to zero for an angle of rotation. More specifically, the attenuators $VR_1$ and $VR_4$ are made of a conductor at their sides to the fronts F from the center points M, whereas the attenuators $VR_2$ and $VR_3$ are made of a conductor at their sides to the backs B from the center points M such that all of them are made coactive with one another.

The power integrated circuit IC has its input terminal $P_4(IN_{2(-)})$ supplied with the left channel signals L through the attenuator $VR_1$, which has its attenuation increased for the rotations from the aforementioned center point M to the side of the back B, and its input terminal $P_3(IN_{2(+)})$ supplied with the right channel signals R through the attenuator $VR_3$ which has its attenuation increased for the rotations from the aforementioned center point M to the side of the front F. As a result, the amplifier circuits $2b$ and $1b$ thus far described amplify the signals R-L at the center points M of the attenuator $VR_1$ and $VR_3$.

On the other hand, the power integrated circuit IC' has its input terminal $P_1'(IN_{1(+)})$ supplied with the right channel signals R through the attenuator $VR_4$, which has its attenuation increased for the rotations from the aforementioned center point M to the side of the back B, and its input terminal $P_2'(IN_{1(-)})$ supplied with the left channel signals through the attenuator $VR_2$ which has its attenuation increased for the rotations from the aforementioned center point M to the side of the front F. As a result, the amplifier circuits $2a'$ and $1a'$ thus far described amplify the signals R-L at the center points of the attenuators $VR_2$ and $VR_4$.

The relationships among the rotational positions F, M and B of the attenuators $VR_1$ to $VR_4$, the outputs of the respective amplifiers, and the inputs to the speakers of the acoustic system thus constructed will be tabulated in Table 1.

TABLE 1

| VR | Output Signals of Each Amplifier | | | | Signals of Each Speaker | |
|---|---|---|---|---|---|---|
|  | $P_5$ ($1a$) | $P_6$ ($1b$) | $P_5'$ ($1a'$) | $P_6'$ ($1b'$) | LF / RF / 2L / 2R | LB / RB / L−R / R−L |
| F | L | −L | R | −R |  |  |
|  | L | R−L | R−L | −R | 2L−R | 2L−R |
|  |  |  |  |  |  | R−L |
| M |  | $\left(\dfrac{R-L}{2}\right)$ | $\left(\dfrac{R-L}{2}\right)$ |  | $\left(\dfrac{3L-R}{2}\right)$ | $\left(\dfrac{3L-R}{2}\right)$ |
|  |  |  |  |  | 2R−L | 2R−L |
|  |  |  |  |  | $\left(\dfrac{3R-L}{2}\right)$ | $\left(\dfrac{3R-L}{2}\right)$ |
| B | L | R | −L | −R | L−R / R−L | 2L / 2R |

In Table 1, letters F, M and B indicate the front, the center point and the back of the attenuators $VR_1$ to $VR_4$. Incidentally, the parenthesized numerals appearing in Table 1 indicate the case, in which a B curve, i.e., those having no conductor portion so that the attenuations are linearly varied in proportion to the angles of rotation are used as the attenuators $VR_1$ to $VR_4$.

According to the embodiment thus far described, since the fader control of the four-amplifier and four-speaker acoustic system can be accomplished at the input unit, such attenuators of small power and size as could not be used in the prior art, in which the fader control has been carried out at the output of high current flow, can be used so that the production cost can be remarkably reduced.

It should be understood that the present invention be not limited to the foregoing embodiments but can be extended to modifications, in which a two channel type circuit is used as the power IC and in which a circuit having a differential amplifier circuit as its input unit is used as the one channel power IC.

What is claimed is:

1. An acoustic monolithic power semiconductor integrated circuit comprising:
a first differential amplifier circuit having non-inverting and inverting inputs led as first and second input terminals of said integrated circuit to the outside of the same, respectively;
a first amplifier output circuit having a non-inverting input supplied with the output signal of said first differential amplifier circuit within said integrated circuit and an inverting input led as first feedback terminal to the outside of said integrated circuit for determining the gain and output DC level of said first amplifier output circuit, said first amplifier output circuit having its output terminal led as a first output terminal of said integrated circuit to the outside of the same, and further comprising:
- a second differential amplifier circuit having non-inverting and inverting inputs led as third and fourth input terminals of said integrated circuit to the outside of the same, respectively; and
- a second amplifier output circuit having a non-inverting input supplied with the output signal of the second-named differential amplifier circuit within said integrated circuit and an inverting input led as a second feedback terminal to the outside of said integrated circuit for determining the gain and output DC level of the second-named amplifier output circuit, the second-named amplifier output circuit having its output terminal led as a second output terminal of said integrated circuit to the outside of the same.

2. An acoustic monolithic power semiconductor integrated circuit according to claim 1, wherein the first-named input terminal is supplied with either the left ones or the right ones of stereophonic signals whereas the third-named input terminal is supplied with the other, and wherein the first-named output terminal is connected with a first speaker whereas the second-named output terminal is connected with a second speaker.

3. An acoustic monolithic power semiconductor integrated circuit according to claim 1, wherein the first-named input terminal and the fourth-named input terminal are supplied with an input signal; and wherein a speaker load is connected between the first-named output terminal and the second-named output terminal.

4. An acoustic system comprising the first and second acoustic monolithic power semiconductor integrated circuits according to claim 1, wherein the first-named acoustic monolithic power semiconductor integrated circuit has its input terminal supplied with the left or right channel input signals and its second input terminal supplied with a bias voltage, wherein said the first-named acoustic monolithic power semiconductor integrated circuit has its fourth input terminal supplied with the left or right channel input signals through a first attenuator and its third input terminal supplied with the right or left channel input signals through a third attenuator, wherein the second-named acoustic monolithic power semiconductor integrated circuit has its first input terminal supplied with the right or left channel input signals through a fourth attenuator and its second input terminal supplied with the left or right channel input signals through a second attenuator, wherein the second-named acoustic monolithic power semiconductor integrated circuit has its fourth input terminal supplied with the right or left channel input signals and its third input terminal supplied with a bias voltage, wherein the first-, second-, third- and fourth-named attenuators are made so coactive that the signal attenuations by the first- and fourth-named attenuators are reciprocal to those by the second- and third-named attenuators, wherein a first speaker is connected between the first- and second-named output terminals of the first-named acoustic monolithic power semiconductor integrated circuit, wherein a second speaker is connected between the first-named output terminal of the first-named acoustic monolithic power semiconductor integrated circuit and the first-named output terminal of the second-named acoustic monolithic power semiconductor integrated circuit, wherein a third speaker is connected between the first- and second-named output terminals of the second-named acoustic monolithic power semiconductor integrated circuit, wherein a fourth speaker is connected between the second-named output terminal of the first-named acoustic monolithic power semiconductor integrated circuit and the second-named output terminal of the second-named acoustic monolithic power semiconductor integrated circuit, wherein the first- and second-named speakers are used for the left or right channel whereas the third- and fourth-named speakers are used for the right or left channel, and wherein the first- and third-named speakers are used for the front or rear whereas the second- and fourth-named speakers are used for the rear or front.

5. An acoustic monolithic power semiconductor integrated circuit comprising:
- a first differential amplifier circuit having non-inverting and inverting inputs led as first and second input terminals of said integrated circuit to the outside of the same, respectively;
- a first amplifier output circuit having a non-inverting input and an inverting input, said non-inverting input of said first amplifier output circuit being DC coupled with the output of said first differential amplifier circuit in said integrated circuit, said inverting input of said first amplifier output circuit being connected to a first feedback terminal through a first feedback resistor formed in said integrated circuit and connected to the output terminal of said first amplifier output circuit through a second feedback resistor formed in said integrated circuit, said first feedback terminal being disposed as one external terminal of said integrated circuit, said output terminal of said first amplifier output circuit being led as a first output terminal of said integrated circuit to the outside of the same;
- a second differential amplifier circuit having non-inverting and inverting inputs led as third and fourth input terminals of said integrated circuit to the outside of the same, respectively; and
- a second amplifier output circuit having a non-inverting input and an inverting input, said non-inverting input of said second amplifier output circuit being DC coupled with the output of said second differential amplifier circuit in said integrated circuit, said inverting input of said second amplifier output circuit being connected to a second feedback terminal through a third feedback resistor in said integrated circuit and connected to the output terminal of said second amplifier output circuit through a fourth feedback resistor in said integrated circuit, said second feedback terminal being disposed as another external terminal of said integrated circuit, said output terminal of said second amplifier output circuit being led as a second output terminal of said integrated circuit to the outside of the same.

6. An acoustic monolithic power semiconductor integrated circuit according to claim 5, wherein said first input terminal and said fourth input terminal are supplied with an input signal, wherein said one external terminal and said other external terminal are connected to ground potential through a first external capacitor and a second external capacitor, respectively, and wherein a speaker load is connected between said first output terminal and said second output terminal.

* * * * *